(12) United States Patent
Nordman

(10) Patent No.: US 6,459,393 B1
(45) Date of Patent: Oct. 1, 2002

(54) APPARATUS AND METHOD FOR OPTIMIZED SELF-SYNCHRONIZING SERIALIZER/DESERIALIZER/FRAMER

(75) Inventor: John Emery Nordman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/074,844

(22) Filed: May 8, 1998

(51) Int. Cl.[7] .................................................. H03M 9/00
(52) U.S. Cl. ....................................... 341/100; 341/101
(58) Field of Search ................................. 341/100, 101; 370/420, 476

(56) References Cited

U.S. PATENT DOCUMENTS

| | | | | |
|---|---|---|---|---|
| 3,912,869 A | * | 10/1975 | Ullako | 179/84 |
| 5,058,141 A | * | 10/1991 | Kem et al. | 375/116 |
| 5,164,940 A | * | 11/1992 | Gray | 370/84 |
| 5,210,754 A | * | 5/1993 | Takahashi et al. | 370/105.4 |
| 5,648,776 A | | 7/1997 | Widmer | 341/100 |
| 5,715,252 A | * | 2/1998 | Sato | 370/543 |
| 5,777,567 A | * | 7/1998 | Murata et al. | 341/100 |
| 6,031,473 A | * | 2/2000 | Kubinec | 341/100 |
| 6,128,312 A | * | 10/2000 | Kurosawa | 370/465 |

* cited by examiner

Primary Examiner—Peguy JeanPierre

(74) Attorney, Agent, or Firm—Schmeiser, Olsen & Watts; Robert R. Williams

(57) ABSTRACT

An apparatus and method for improving the communication capabilities of computer systems is disclosed. The most preferred embodiments of the present invention use a series of data buffers and data registers to process an incoming high speed data signal. By using the buffers and registers, the incoming signal can be reformatted and manipulated at a much lower frequency than the original transmission frequency. The deserializer of the present invention also samples a greater portion of the incoming data signal than usual to further increase reliability. These various features of the invention provide for a more stable and reliable communication link and will also provide a less expensive solution for serialization/deserialization. The present invention includes a serializer that receives parallel data input from a computer and serializes the data for transmission over a high-speed serial communication link. On the receiving end, the present invention provides a deserializer that can quickly and efficiently transform the serial data back into parallel form for use within the computer system on the receiving end. By utilizing two related clock signals, one clock signal being an integer multiple of the other, a self-synchronizing serializer/deserializer can be created. In addition, by increasing the size of the data sample on the receiving end, the comparisons necessary to retrieve a parallel signal from a serial transmission can occur at a much lower frequency than the frequency of the serial transmission. In the most preferred embodiment, the invention is provided as a integrated solution manufactured on a Peripheral Component Interconnect (PCI) card, thereby allowing the present invention to be easy installed into existing computer systems.

23 Claims, 7 Drawing Sheets

APPARATUS AND METHOD FOR OPTIMIZED SELF-SYNCHRONIZING SERIALIZER/DESERIALIZER/FRAMER

BACKGROUND OF THE INVENTION

1. Technical Field

This invention generally relates to computer systems and more specifically relates to transmitting digital data from one location to another.

2. Background Art

The development of the EDVAC computer system of 1948 is often cited as the beginning of the computer era. Since that time, computer systems have evolved into extremely sophisticated devices, and computer systems may be found in many different settings. Computer systems typically include a combination of hardware (e.g., semiconductors, circuit boards, etc.) and software (e.g., computer programs). As advances in semiconductor processing and computer architecture push the performance of the computer hardware higher, more sophisticated computer software has evolved to take advantage of the higher performance of the hardware, resulting in computer systems today that are much more powerful than just a few years ago.

Computer systems typically include operating system software that controls the basic function of the computer, and one or more software application programs that run under the control of the operating system to perform desired tasks. For example, a typical IBM Personal Computer may run the OS/2 operating system, and under the control of the OS/2 operating system, a user may execute an application program, such as a word processing program. One of the fastest growing uses of computer systems is the field of computer communications and the related use of computer networks to transmit information from one place to another. Given recent advances in network communications such as the World Wide Web and the increased emphasis on connectivity provided by Network Computers (NCs), the amount of data being transmitted from computer system to computer system is increasing rapidly. In concert with the increased reliance on computer communications, the efficient and accurate transmission of data is becoming increasingly important. This trend will only accelerate and reliable data transmission will become more critical in the future as the use of computers and computer networks continues to expand.

Within a given computer system, data is usually transported in a parallel format along a digital data path that is "N" bits wide to accommodate a discrete piece of information or data termed a "byte" or a "word." In most computer systems, N is typically an integer multiple of eight. The parallel format of the data allows multiple data bits to be transmitted simultaneously over the internal data path of the computer, thereby increasing the speed with which information is transferred from one place to another. While the parallel transmission of data is useful for the short data paths that exist within most computer systems, transmitting data in a parallel format over significant distances is not practical due to the increased cost and difficulty of implementing parallel data paths over a long distance.

Therefore, in most cases, the transmission of digital data over longer distances is accomplished by sending the data in a high-speed serial format (i.e., one single bit after another) over a communication link designed to handle computer communications. In this fashion, data can be transferred from one computer system to another, even if the computer systems are geographically remote. For example, most telephone companies use high-speed serial transmission lines for backbones in telephone networks. Many other organizations, companies, and universities have also adopted similar standards and communicate between disparate locations over serial communication links.

In order for high-speed serial transmission to occur, the digital data signal from inside the computer must be transformed from the parallel format into a serial format prior to transmission of the data over the serial communication link. This transformation is generally accomplished by processing the computer's internal data signal through a piece of computer equipment known as a "serializer." The function of the serializer is to receive a parallel data stream as input and, by manipulating the parallel data stream, output a serial form of the data capable of high-speed transmission over a suitable communication link. Once the serialized data has arrived at the desired destination, a piece of computer equipment known as a "deserializer" is employed to convert the incoming data from the serial format to a parallel format for use within the destination computer system.

While the general process for transmission of digital data via high-speed communication links is well known, there are several significant limitations associated with the existing methods. One of the most significant problem associated with transmitting high speed serial data signals occurs on the receiving end. When the high speed serial signal is received at the desired destination, it must be transformed from a serial signal back into a parallel signal for use within the destination computer system. Existing deserialization devices receive the incoming high-speed data signal and perform the initial processing of the data signal at the same frequency as originally transmitted. This means that the receiving computer must be able to extract the data from the high-speed serial signal at a rate commensurate with the frequency of the incoming data signal. As the frequency of the incoming data signal increases, this becomes increasingly difficult to accomplish because most presently used receiving equipment simply cannot reliably process the data and transform it beyond certain frequency thresholds.

While it is desirable and theoretically possible to further increase the speed of transmission for serial data signals beyond the currently employed levels, existing deserialization equipment cannot reliably extract the information and reformat the data signal into parallel form at higher frequencies. The theoretical limits of high-speed data communications have not yet been reached due to the physical and logical constraints in the commonly used components of presently known devices. The intricate timing and coordination requirements necessary to process increased frequency high-speed data signals is beyond most currently available solutions. In addition, the design and use of next-generation high-speed components that can efficiently and effectively process high-speed serialized data signals is very expensive. This limits any possible solutions using these high-speed components to a fairly narrow range of applications where cost is not a significant factor.

As computer communication becomes increasingly widespread, it will become even more critical to develop better equipment for transmitting high-speed serial data signals from one location to another. Without providing improved equipment and techniques for high-speed computer communications, information transfers over computer networks will continue to be less than optimal. The practical constraints of the present equipment and methods will, therefore, remain a limiting factor and will continue to slow the growth and beneficial use of computer transmitted data, particularly at the more desirable high speeds.

DISCLOSURE OF INVENTION

According to the preferred embodiments of the present invention, an apparatus and method for improving the communication capabilities of computer systems is disclosed. The serializer and deserializer of the present invention each utilize a pair of related clock signals to allow the operation of a self-synchronizing device. No external synchronization signal is necessary for the operation of the serializer or deserializer. The most preferred embodiments of the present invention use a series of data buffers and data registers to process an incoming high speed data signal. By using the buffers and registers, the incoming signal can be reformatted and manipulated at a much lower frequency than the original transmission frequency. The deserializer of the present invention also samples a greater portion of the incoming data signal than usual to further increase reliability by reducing circuit complexity and timing issues. These various features of the invention provide for a more stable and reliable communication link and will also provide a less expensive solution for serialization/deserialization.

BRIEF DESCRIPTION OF DRAWINGS

The preferred embodiments of the present invention will hereinafter be described in conjunction with the appended drawings, where like designations denote like elements; and.

BEST MODE FOR CARRYING OUT THE INVENTION

Figure 1:
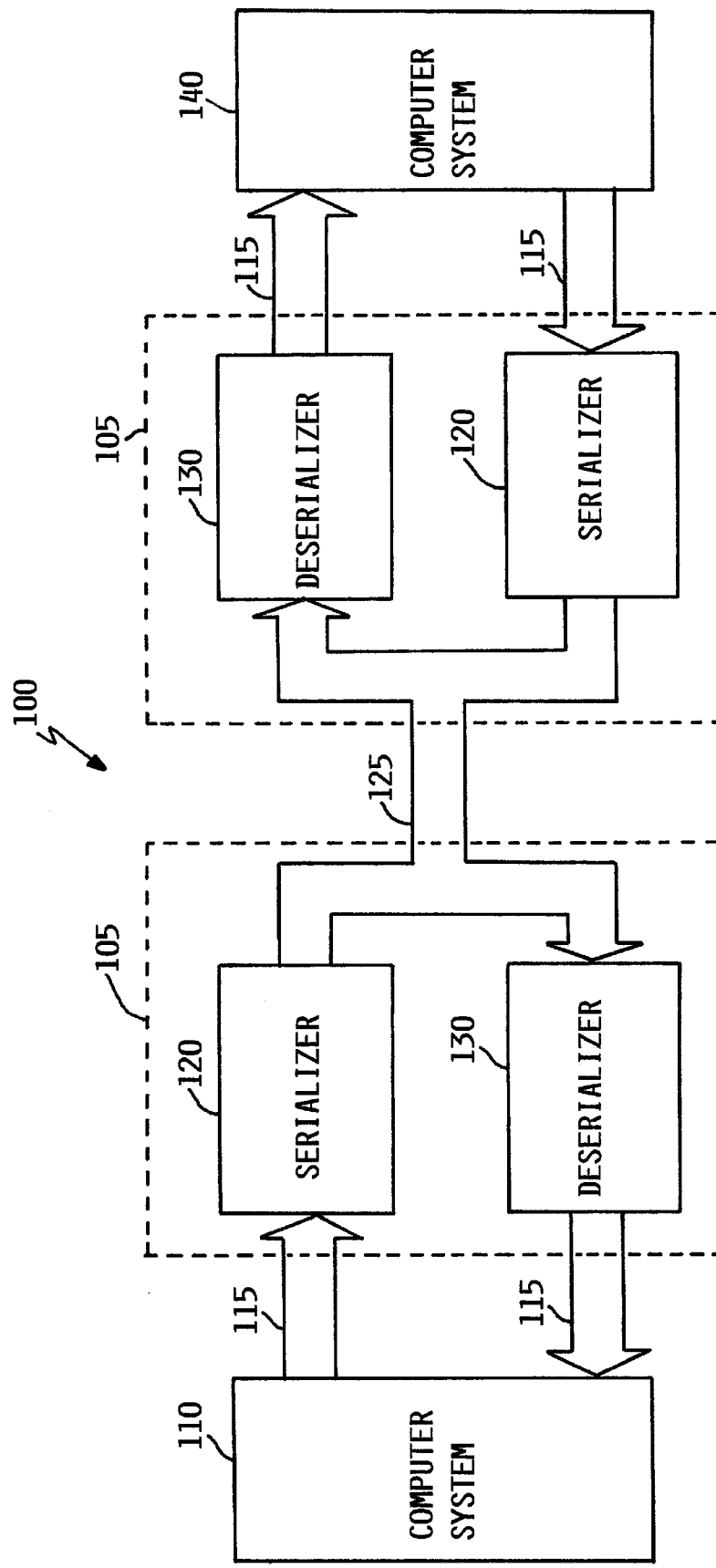
FIG. 1 is a block diagram of an serializer/deserializer/framer apparatus according to a preferred embodiment of the present invention.

The preferred embodiments of the present invention provide an apparatus and method for an optimized self-synchronizing serializer/deserializer/framer. According to the present invention, a parallel data stream from a computer system at a first location is converted to a serial data stream and the serial data stream is transmitted to a computer system at a second location where it is transformed back into a parallel data stream for use within the second computer system.

Since the present invention is related to computer communications, the overview section below includes additional background information regarding communication protocols useful for understanding the preferred embodiments of the present invention. Those individuals who are familiar with computer communications and the related protocols may skip the overview section and proceed directly to the detailed description section.

1. Overview

Several international conventions have been developed and promulgated for the standardized transmission of digital data signals in a serial format. Some of the more commonly used standards include: Synchronous Optical Network (SONET); Synchronous Digital Hierarchy (SDH); FIBRE-CHANNEL; Fiber Distributed Digital Interface (FDDI); GIGABIT-ETHERNET; and others. Each of these independent standards employs a slightly different technique for serialization which includes a compartmentalization of the digital data into discrete units known as "frames." Each standard framing definition also describes how the digital data signal is arranged within the frame so that the receiving station is aware of the proper steps needed to reformat the data back into parallel format after receipt.

As one example, the SONET standard at the 155 Mbit transmission rate uses a six byte framing sequence to initially identify or delineate a 2430 byte frame of data. This means that there is a series of information bytes defined by SONET that are always positioned to be the first six bytes of every frame transmitted. These six "framing bytes" are called A1, A1, A1, A2, A2, and A2. The value of each of the six framing bytes, respectively, is always 0xF6, 0xF6, 0xF6, 0x28, 0x28, and 0x28. These six framing bytes effectively signify and mark the start of each frame. Since many other transmission functions are also performed with respect to a given frame of data, (e.g., parity calculations across the frame, frame synchronous data scrambling, location of overhead information within the frame header, etc.) these six fixed-position framing bytes provide the reference markers which allows the rest of the information contained in the frame to be properly recovered without the use of additional markers to identify each different portion of the data in the frame. By locating the framing bytes and using a calculated offset, each and every byte of information within the frame can be quickly and accurately identified according to the promulgated standard. This allows the receiving station to efficiently and effectively reformat the serial data stream into a parallel data stream upon receipt. The other standard protocols listed above also employ some roughly analogous series of framing bytes or a framing sequence identifier to mark the beginning of each frame of data.

The use of these unique framing pattern identifiers also provide a mechanism for error recovery by allowing reacquisition of frame synchronization in the middle of data transmission. For example, if a transmission link is interrupted or broken during a data transmission, the network may automatically switch to a backup or secondary network in order to complete the data transmission. This switch usually occurs "on the fly." Since the data transfer continues uninterrupted from the source, some data is typically lost and the position of the frame boundary references will shift in relation to its position in relation to the data. The receiving equipment typically detects this shift and re-adjusts. Since reacquisition of the signal occurs, only the lost data will need to be re-transmitted.

Similar to the SONET standard, the Fibre-Channel protocol uses a single 10-bit framing sequence called K28,5 which uses a unique framing pattern with the value of 0b0011111010 or 0b1100000101. As with the SONET standard, the Fibre-Channel protocol uses these 10 bits to identify the beginning of each frame, thereby permitting data manipulation to take place in a systematic way for all data transmitted using this protocol.

Computer systems that are used to transmit and/or receive digital communications will typically be configured with specialized equipment to support network communications, including the ability to use framing patterns. Since most computers which serve as data transmission sources also serve as destination or receiving points for incoming data, it is common to include both functions in a single piece of equipment, known as a serializer/deserializer (SERDES). The SERDES equipment will use the above-identified framing patterns to transform data for communication purposes.

Although the use of a unique framing pattern to mark the beginning of a frame is widespread, when existing SERDES units perform the required processing and framing functions for high-speed serial data streams, it is often difficult to control design factors such as timing, clock loading, and signal noise. Since every data signal takes a certain amount of time to be processed through a SERDES, timing limitations and synchronization requirements can become controlling factors at very high data transmission speeds. These high-speed communication-related problems can negatively impact design time, integrated circuit clock loading, and signal noise. This, in turn, can increase new product design time, introduce unnecessary complexity into the system, and increase overall signal transmission costs. As physical transmission media technology improves, theoretical transmissions speeds will also improve. However, given the practical limitations of existing SERDES equipment, it may not be possible to translate theoretical limits into actual transmission speed gains.

2. Detailed Description

The present invention includes a serializer that receives parallel data input from a computer and serializes the data for transmission over a high-speed serial communication link. On the receiving end, the present invention provides a deserializer that can quickly and efficiently transform the serial data back into parallel form for use within the computer system on the receiving end. By utilizing two related clock signals, one clock signal being an integer multiple of the other, a self-synchronizing serializer/deserializer can be created. In addition, by using data buffers and data registers to increase the size of the data sample on the receiving end, the comparisons necessary to construct a parallel signal from a serial transmission can occur at a much lower frequency than the frequency of the original serial transmission. This feature reduces complexity and increases reliability. In the most preferred embodiment, the invention is provided as a integrated solution manufactured on a Peripheral Component Interconnect (PCI) card, thereby allowing the present invention to be easy installed into existing computer systems.

Referring now to FIG. 1, an apparatus according to a preferred embodiment of the present invention includes: a first computer system 110; two serializer/deserializer/framers 105; a second computer system 140; a high-speed serial communication link 125; and several N bit wide parallel data paths 115 which connect computer systems 110 and 140 each to a serializer/deserializer/framer 105. Each serializer/deserializer/framer 105 includes a transmitter 120 and a receiver 130.

By using the apparatus of FIG. 1, parallel data is introduced from first computer system 110 to serializer 120 via N bit wide parallel data path 115, serialized, and provided at the high-frequency rate from the most significant bit of high-frequency register 230 in the form of a serial data output signal. Once the data has been serialized in this fashion, it can be transmitted to another location via high-speed serial communication link 125. Communication link 125 is any type of communication link known to those skilled in the art. This would include fiber optics links, infra-red signals, standard cables, telephone connections, wireless communication links, etc. Once the serial data signal has been received by deserializer 130, the serial data is transformed into a parallel data signal and forwarded to computer 140 via N-bit wide parallel data path 115. In a similar fashion, parallel data is sent from computer 140 via data path 115 to serializer 120 where it is serialized, over communication link 125 to deserializer 130, where it is deserialized, and then to computer 110 via data path 115.

It should be noted that although computer systems 110 and 140 are shown separate from serializer/deserializer/framers 105, it is anticipated that the most preferred embodiments of the present invention will provide a serializer/deserializer/framer 105 apparatus as an integral part of an existing computer system. For example, as discussed in conjunction with FIG. 6 below, a serializer/deserializer/framer 105 might be manufactured on a PCI card and could be inserted into a PCI slot in any computer system chassis which is designed to receive PCI cards. This configuration would allow a computer system to both send and receive data signals using the preferred embodiments of the present invention as described herein. The separation of the components in the accompanying figures is merely for purposes of explanation. In addition, it is not necessary to have two computers equipped with serializer/deserializer/framer 105 in order to practice the present invention. Since the present invention is self-contained, it can function with the existing data transmission equipment currently in use today.

Figure 2:
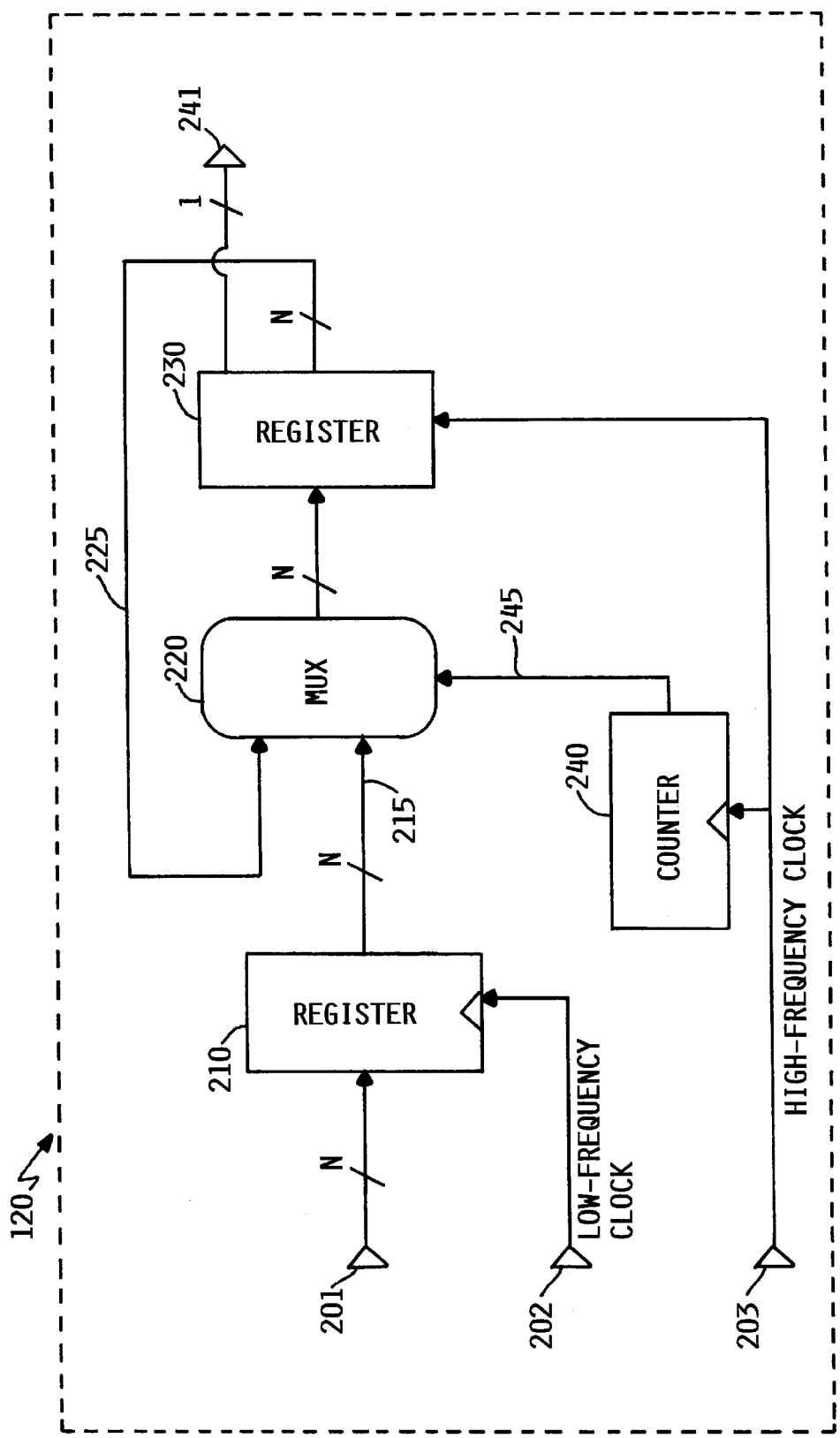
FIG. 2 is a block diagram of a transmitter according to a preferred embodiment of the present invention.

Referring now to FIG. 2, a serializer 120 of width N according to a preferred embodiment of the present invention includes: an N bit wide low-frequency data register 210; an N bit wide two-to-one multiplexor (MUX) 220; an N bit wide high-frequency data register 230; a log2(N) bit free-running counter 240; a terminal-count output signal 245; a parallel data input signal 201; a low-frequency clock signal 202; a high-frequency clock signal 203; a parallel data feedback loop 225; and a serial data output signal 241.

Counter 240 is clocked at a high-frequency rate as determined by high-frequency clock signal 203. Typically, high-frequency clock signal 203 will be generated by a phase-locked loop (not shown) and low-frequency clock signal 202 will be generated from high-frequency clock signal 203 by the use of additional frequency reducing combinational logic (not shown). The clock rate for low-frequency data register 210 will be the clock rate for counter 240 divided by N.

Low-frequency data register 210 is clocked by low-frequency clock signal 202. The output of low-frequency data register 210 is connected via an N-bit wide data path to one set of inputs on two-to-one MUX 220 and the bit-shifted output from high-speed data register 230 is connected to the other set of inputs on two-to-one MUX 220 via N-bit wide data feedback loop 225. The terminal-count output signal 245 of counter 240 is connected to the MUX select input of MUX 220. The latching clock edge of high-frequency data register 230 must be synchronous (an exact frequency multiple) of the launching clock edge of low-frequency data register 210, and register timing constraints must be maintained to avoid metastability induced failures. By using this configuration, every clock signal from high-frequency clock signal 203 causes one bit of the data contained in high-speed data register 230 to be sent out as part of serial data output signal 241.

MUX 220 then receives the shifted input of the data, thereby shifting the next bit into position for output on serial data output signal 241. In addition, since every N cycles of high-frequency clock signal 203 equals one clock signal for low-frequency data register 210, every N cycles of high-frequency clock signal 203 causes a new N-bit wide parallel data segment to be loaded into low-frequency data register 210.

By using an apparatus according to the preferred embodiments of the present invention, transmit data is introduced to low-frequency register 210 via an N-bit wide parallel data input signal 201, serialized, and provided at the high-frequency rate from the most significant bit of high-frequency register 230 in the form of serial data output signal 241. Once the data has been serialized in this fashion, it can be transmitted to another location via communication link 125 shown in FIG. 1.

Significantly, the total "clock loads," or number of devices being driven by high-frequency clock signal 203 is just [N+log2(N)]. This is important since it is desirable to minimize the number of devices being driven by a given clock, thereby increasing overall circuit reliability. The maximum propagation delay for high-frequency signals is from low-frequency data register 210, through two-to-one MUX 220 and to high-frequency data register 230, with no other logic being required. This specific embodiment allows counter 240 can be free-running and requires no external synchronization or initialization logic, since it will function properly with an arbitrary phase relationship to low-frequency clock signal 202. The relationship between the clock signals is self-synchronizing.

Figure 3:
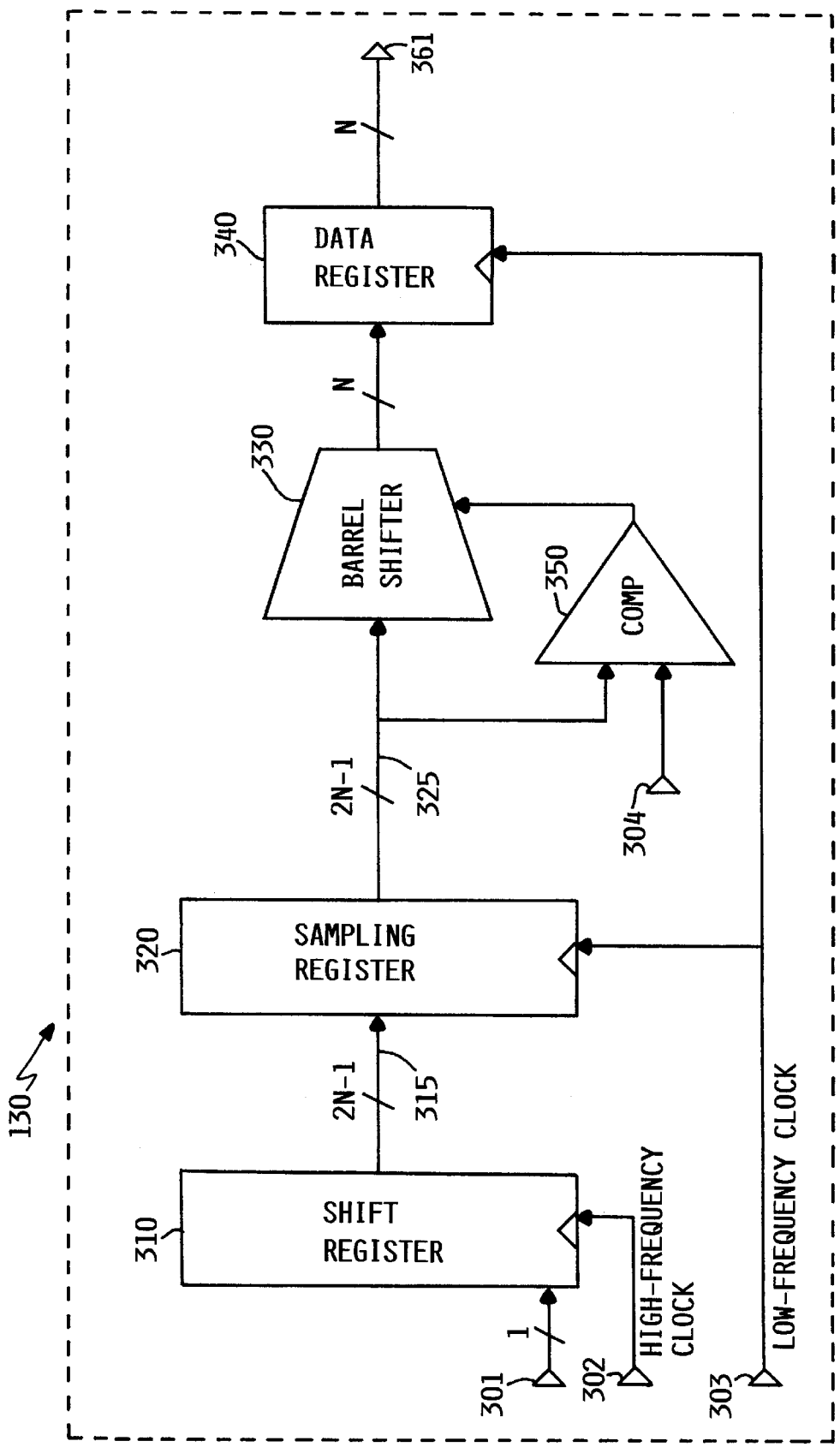
FIG. 3 is a block diagram of a receiver according to a preferred embodiment of the present invention.

Referring now to FIG. 3, a deserializer/framer 130 of width N according to a preferred embodiment of the present invention includes: a [2N−1] bit free-running high-frequency serial shift register 310; a [2N−1] bit low-frequency parallel sampling register 320; a [2N−1] bit barrel shifter 330; an N bit low-frequency data register 340; an N−1 by N bit comparator 350; a serial data input signal 301; a high-frequency clock signal 302; a low-frequency clock signal 303; a frame sequence signal 304; and a parallel data output signal 361.

Serial data is presented to the least significant bit of high-frequency shift register 310 by serial data input signal 301. Serial data input signal 301 is received by any mechanism capable of receiving a high speed serial data signal as described herein. Register 310 continuously shifts the data bits from serial input data signal 301(from low order bit to high order bit) at the high-frequency clock rate as determined by high-frequency clock signal 302. In addition, the contents of shift register 310 are sampled (in parallel) by low-frequency sampling register 320. This sampling event takes place once every low-speed clock cycle as determined by low-frequency clock signal 303. If N=8, then low-frequency sampling register 320 samples the contents of high-frequency shift register 310 once every eight cycles of high-frequency clock signal 302. The data from low-frequency sampling register 320 is the input signal for comparator 350 and is also made available to barrel shifter 330.

Comparator 350 than checks for the occurrence of the first N bits of the desired framing pattern anywhere in the [2N−1] bit sequence. In the case of N=8, comparator 350 is looking for an 8-bit framing sequence within a 15-bit pattern. As shown in FIG. 3, comparator 350 has two inputs, the sampled incoming data from low-frequency sampling register 320 and the desired framing sequence for the selected protocol from frame sequence signal 304. Comparator 350 compares these two sets of data, searching for the unique framing pattern that marks the beginning of an incoming transmission. This pattern-matching activity occurs at the low-frequency clock rate, where speed-related matching errors are far less likely to occur. Once the appropriate framing sequence is found, barrel shifter 330 presents the desired N bits to low-frequency data register 340 and the position of the desired 8-bit framing sequence within the 15-bit sequence is noted by comparator 350 as an offset distance. The barrel shift offset distance (i.e., location of the 8-bit subsequence within the 15 bit sequence) is then maintained while the rest of the framing sequence is being checked by standard framing logic down-stream from the SERDES. The barrel shift offset distance that was found by comparator 350 continues to be maintained once a complete framing pattern is recognized or received. This means that deserializer/framer 130 continually provides the correctly framed data, until there is a need to again search for a new framing sequence.

It should be noted that frame sequence signal 304 can be manipulated to account for any type of framing sequence known to those skilled in the art. Although there are many different communication protocols, as previously explained, each of the protocols has a unique framing pattern which can be used to create frame sequence signal 304. By altering frame sequence signal 304 for various communication protocols, it is anticipated that the present invention can be adapted for use with all known protocols.

Much like the transmitter logic described in conjunction with FIG. 2 above, the launching clock edge of the high-frequency register must be synchronous (an exact frequency multiple) of the latching clock edge of the low-frequency register, and register timing constraints must be maintained to avoid metastability induced failures. The clock rate for sampling register 320 will be the clock rate for shift register 310 divided by N. The total clock loads for high-frequency clock signal 302 is just [2N−1]. The maximum propagation delay for high-frequency signals is from shift register 310 to the sampling register 320. No intermediate logic is required to synchronize the two clock signals. Similar to the discussion of the transmitter presented above, no external initialization or synchronization logic is required. The specific embodiment of deserializer/framer 130 of the present invention as shown in FIG. 3 is only one possible mechanism for transforming serial data input signal 301 into parallel data output signal 361. It is important to note that the transmission frequency of serial data input signal 301 is not the same frequency used to process parallel data output signal 361. Other, similar hardware arrangements can also be utilized in a similar fashion to accomplish similar results.

Figure 4:
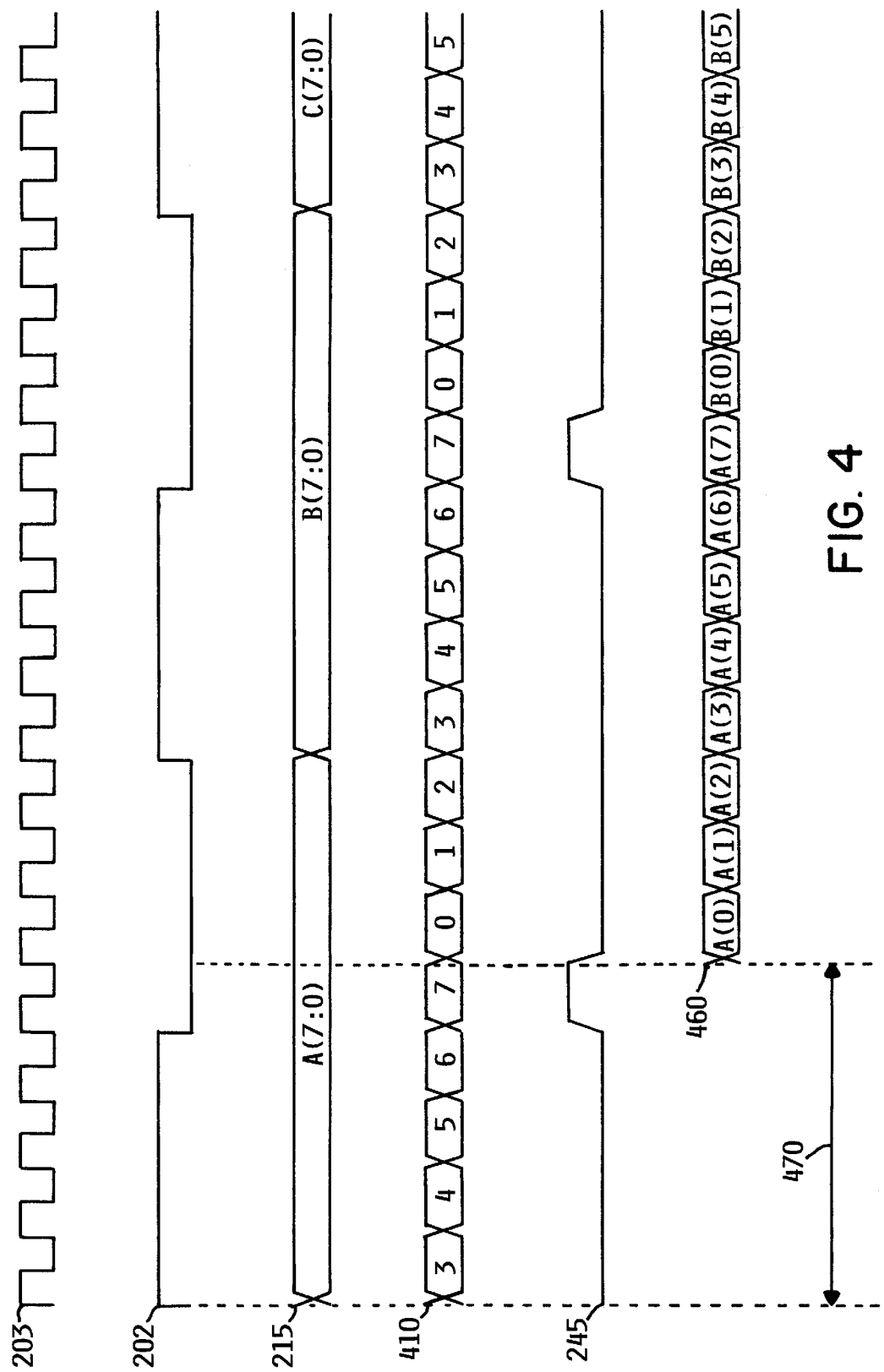
FIG. 4 is a series of timing diagrams showing the relationship between various serialization/transmission signals used in the preferred embodiments of the present invention.

Referring now to FIGS. 2 and 4, a series of timing diagrams for a preferred embodiment of the transmit portion of the present invention are shown. For clarity, the diagrams are shown with N from FIG. 2 arbitrarily assigned equal to eight. This implies that the frequency of high-frequency clock signal 203 is eight-times the frequency of low-frequency clock 202. It should be noted that eight is only one acceptable value for N and other values are equally permissible.

The data from parallel input signal 201 is captured by low-frequency register 210 on the active edge of low-frequency clock signal 202 and presented as an output signal 215 by low-frequency register 210. Counter 240 continuously sequences from zero to seven as shown by signal 410 at the rate of high-frequency clock signal 203 and generates a terminal count signal 245 as it reaches seven. Terminal-count output signal 245 is then used to source low-frequency register output signal 215 to high-frequency register 230. When terminal count signal 245 is not active, the bit-shifted output of high-frequency register 230 is presented to the input of MUX 220 through MUX 220 via parallel data feedback loop 225. This provides serialized data stream 241 from the most significant bit of high-frequency register 230. Again significantly, the arbitrary alignment 470 between the active edge of low-frequency clock signal 202 and the occurrence of the terminal count signal 245 implies a self-synchronizing design where there is no need for counter initialization logic.

Figure 5A:
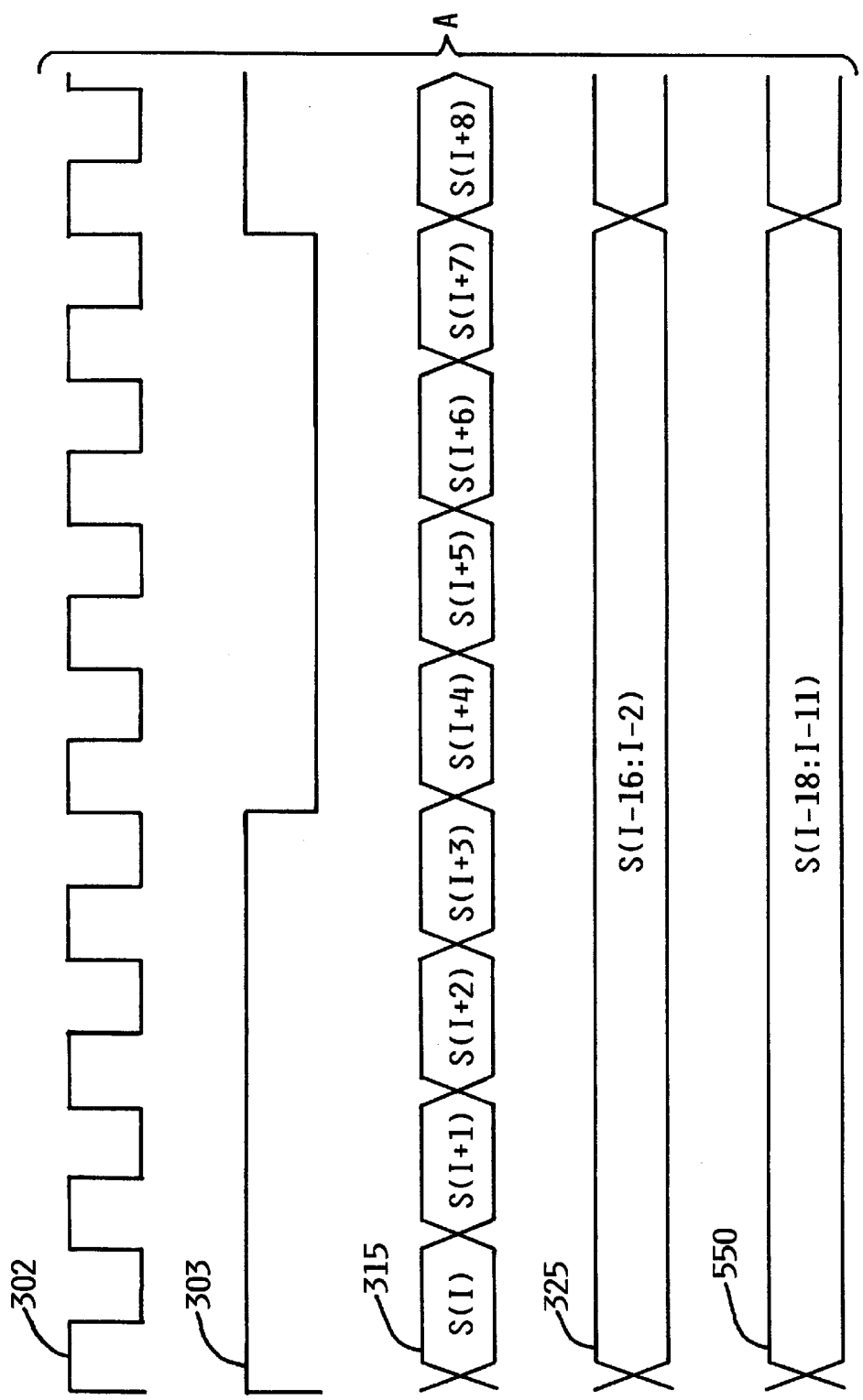
FIG. 5 is a series of timing diagrams showing the relationship between various deserialization/receive signals used in the preferred embodiments of the present invention.
Figure 5B:
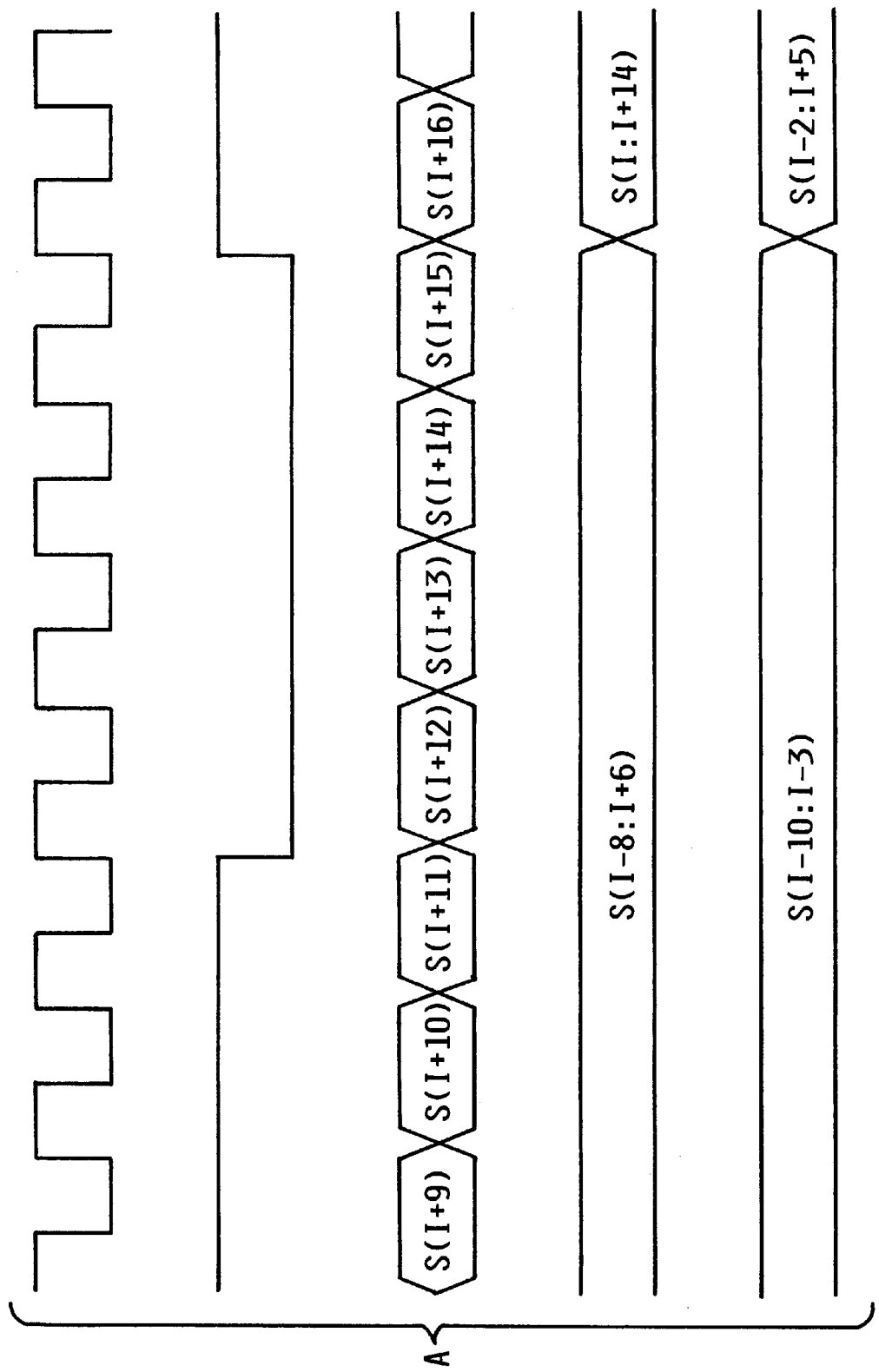

Referring now to FIGS. 3 and 5, a series of timing diagrams for a preferred embodiment of the receive portion of the present invention are shown. Again for clarity, the diagrams are shown with the value of N arbitrarily assigned to be eight. This implies that high-frequency clock signal 302 is eight-times the rate of low-frequency clock signal 303. The data from serial input signal 301 is captured by high-frequency shift register 310 on the active edge of the high-frequency clock 302 and presented in parallel form at this register's output as parallel data signal 315. Low-frequency sampling register 320, in turn, captures this data on the active edge of low-frequency clock 303 and presents it as output signal 325.

Comparator 350 looks for the first byte of the desired framing sequence within output signal 325 and, once found, presents the required offset or shift distance to barrel shifter 330. The properly aligned data is then presented by barrel shifter 330 to low-frequency data register 340 where it is sampled and presented as output signal 361 for use by computer 140.

To illustrate one possible alignment, FIG. 5 shows serial data "S" 315 with an arbitrary bit index "I". The alignment of the output data 550 is shown for the case where the framing sequence was found to begin one bit above the least significant bit of low-frequency sampling register output 325. The actual alignment will vary each time the present invention is powered on, initialized, or when the source or alignment of the incoming serial stream is altered. However, it is important to note that no dedicated synchronization logic is required in order for the synchronization to occur.

Figure 6:
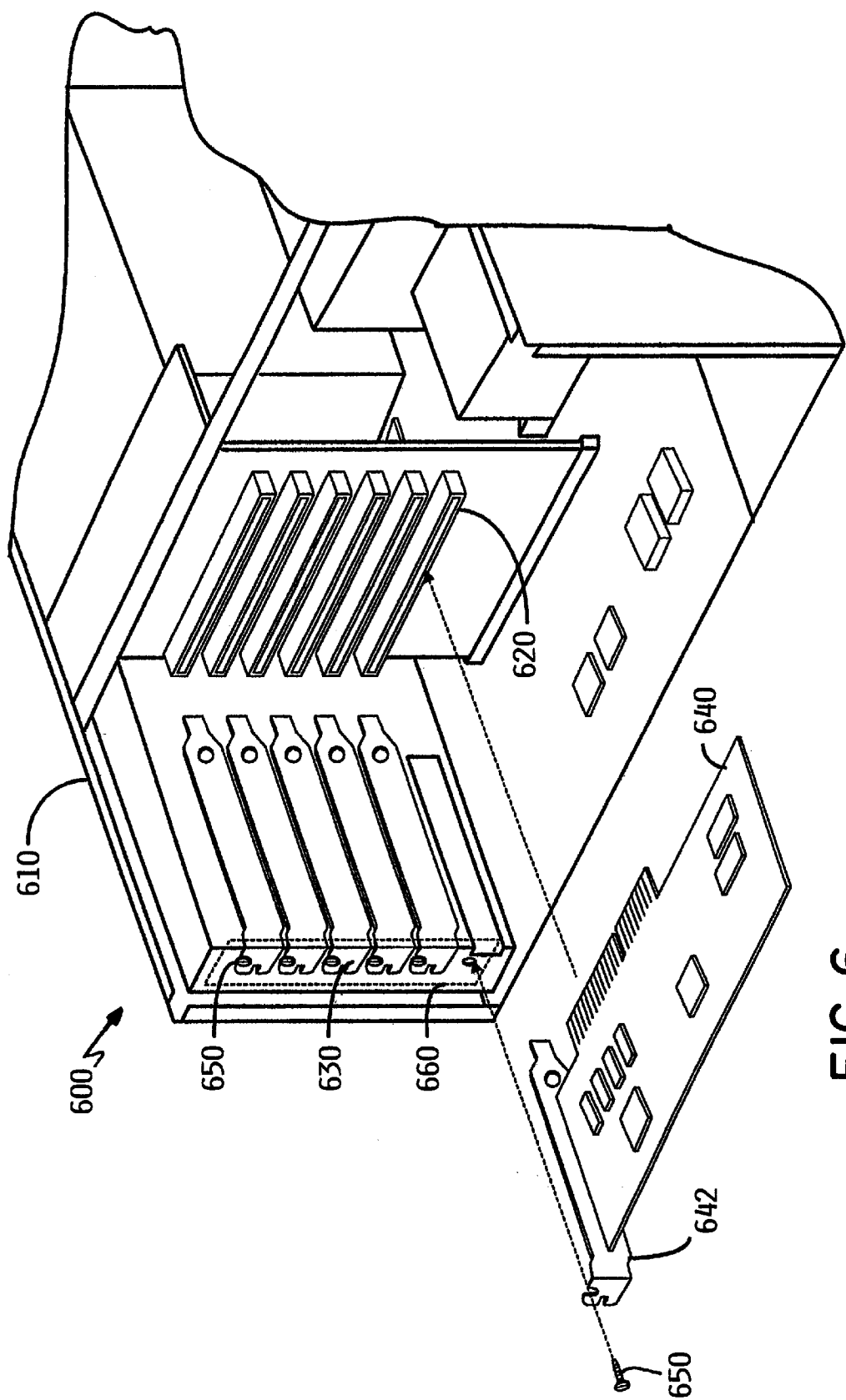
FIG. 6 is a perspective view of a PCI card containing a serializer/deserializer according to a preferred embodiment of the present invention being installed in a computer.

Referring now to FIG. 6, one preferred embodiment of the present invention is illustrated in conjunction with a PCI card which can be inserted into any computer slot designed to receive industry-standard PCI cards. Since the PCI standard has been adopted as a widely implemented technology for computer expansion, it is anticipated that the present invention may be readily adapted for use in most computer systems. In FIG. 6, an interior portion of a computer 600 includes: chassis/frame 610; PCI slots 620; PCI slot access covers 630; and one or more PCI cards 640. PCI cards 640 and PCI slot access covers 630 are securely held in place by fasteners 650. In this configuration, PCI card 640 includes a preferred embodiment of serializer/deserializer/framer 105 and the associated logic. PCI card 640 will also have suitable connectors which will allow it to be connected to high-speed serial communication link 125.

As shown in FIG. 6, each PCI card 640 is attached to a PCI card mounting bracket 642 and PCI cards 640 are installed into PCI slots 620. PCI cards 640 and PCI slot access covers 630 are attached to a mounting location 690. Mounting location 690 has a series of pre-drilled holes to accommodate fasteners 650 and is typically an integral part of chassis/frame 610. Further, mounting location 690 provides a secure structure for attaching PCI cards 640 and PCI slot access covers 630. Note that each PCI card 640 and each access cover 630 has a mounting face 643. Mounting faces 643 each have a hole or a slot which can accommodate a fastener 650.

It is important to note that while the present invention has been described in the context of computer hardware, those skilled in the art will appreciate that several of the components mechanisms of the present invention are also capable of being distributed as a program product by signal bearing media in a variety of forms, and that the present invention applies equally regardless of the particular type of signal bearing media to actually carry out the distribution. Examples of signal bearing media include: recordable type media such as hard disks, floppy disks (e.g., disk 180) and CD ROMS, and transmission type media such as digital and analog communication links, including wireless communication links.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the forthcoming claims.

What is claimed is:

1. An apparatus comprising:
    an N-bit wide low-frequency register operating at a first frequency;
    a two-to-one multiplexor coupled to the low-frequency register, the low-frequency register providing an N-bit wide parallel data signal to the multiplexor;
    a counter operating at a second frequency, the counter providing a select signal to the multiplexor; and
    an N-bit wide high-frequency register operating at the second frequency, coupled to the multiplexor, the high-frequency register receiving the N-bit wide parallel data signal from the multiplexor and returning a bit-shifted version of the parallel data signal to the multiplexor.

2. The apparatus of claim 1 wherein the N-bit wide low-frequency register is an eight-bit data register.

3. The apparatus of claim 1 wherein the N-bit wide high-frequency register is an eight-bit data register.

4. The apparatus of claim 1 wherein the ratio of the second frequency to the first frequency is 8.

5. The apparatus of claim 1 wherein the first and second frequencies are generated by a phased-lock loop.

6. The apparatus of claim 1 wherein the first frequency is an integer multiple of the second frequency.

7. The apparatus of claim 6 wherein the integer multiple is eight.

8. An apparatus comprising:
    a 2N–1-bit wide high-frequency shift register operating at a first frequency;
    a 2N–1-bit wide two-to-one sampling register operating at a second frequency, the sampling register being coupled to the high-frequency shift register, the high-frequency shift register providing a 2N–1-bit wide parallel data signal to the sampling register;
    a 2N–1-bit wide barrel shifter coupled to the sampling register;
    a comparator coupled to the sampling register, the comparator comparing a predetermined framing sequence with the 2N–1-bit wide parallel data signal; and
    an N-bit wide data register operating at the second frequency, the data register being coupled to the barrel shifter, the data register receiving an N-bit wide data signal from the barrel shifter.

9. The apparatus of claim 8 wherein the 2N–1-bit wide high-frequency shift register is a fifteen-bit shift register.

10. The apparatus of claim 8 wherein the N-bit wide data register is an eight-bit data register.

11. The apparatus of claim 8 wherein the first and second frequencies are generated by a phased-lock loop.

12. An apparatus comprising:

a serializer, the serializer comprising:
: an N-bit wide low-frequency register operating at a first frequency;
: a two-to-one multiplexor coupled to the low-frequency register, the low-frequency register providing an N-bit wide parallel data signal to the multiplexor;
: a counter operating at a second frequency, the counter being coupled to the multiplexor, thereby providing a select signal to the multiplexor; and
: an N-bit wide high-frequency register operating at the second frequency, coupled to the multiplexor, the high-frequency register receiving the N-bit wide parallel data signal from the multiplexor and returning a bit-shifted version of the parallel data signal to the multiplexor; and a deserializer, the deserializer comprising:
: a 2N−1-bit wide high-frequency shift register operating at a third frequency;
: a 2N−1-bit wide two-to-one sampling register operating at a fourth frequency, the sampling register being coupled to the high-frequency shift register, the high-frequency shift register providing a 2N−1-bit wide parallel data signal to the sampling register;
: a 2N−1-bit wide barrel shifter coupled to the sampling register;
: a comparator coupled to the sampling register, the comparator comparing a predetermined framing sequence with the 2N−1-bit wide parallel data signal; and
: an N-bit wide data register operating at the fourth frequency, the data register being coupled to the barrel shifter, the data register receiving an N-bit wide data signal from the barrel shifter.

13. A method comprising the steps of:
at a first clock frequency, loading an N-bit wide parallel data signal into a low-frequency register;
loading the parallel data signal from the low-frequency register into a two-to-one multiplexor;
loading the parallel data signal from the multiplexor into a high-frequency register; and
at a second clock frequency that is N times faster than the first clock frequency, shifting one bit of the parallel data signal out as a serial signal.

14. The method of claim 13 further comprising the step of shifting the output of the high-frequency register and providing the shifted output as an input signal to the multiplexor.

15. The method of claim 13 wherein the first clock frequency and the second clock frequency are generated by a phased lock loop.

16. The method of claim 13 wherein N equals eight.

17. A method comprising the steps of:
at a first clock frequency, converting an incoming serial data signal into a parallel data signal that has a width equal to 2N−1 bits;
at a second clock frequency that is N times slower than the first clock frequency, comparing the parallel data signal with a desired framing sequence to calculate an offset; and
using the calculated offset to select an N bit wide subset of the parallel data signal.

18. The method of claim 17 wherein the step of comparing the parallel data signal with a desired framing sequence to calculate the offset is performed by a comparator.

19. The method of claim 17 wherein N equals eight.

20. A method comprising the steps of:
receiving an incoming serial data signal;
shifting the serial data signal into a shift register at a first clock frequency, thereby converting the incoming serial data signal into a parallel data signal that is 2N−1 bits wide;
sampling the parallel data signal in the shift register at a second clock frequency, wherein the first clock frequency is an integer multiple of the second clock frequency;
transferring the sampled parallel data signal into a barrel shifter;
using an offset to select an N bit wide subset of the sampled parallel data signal in the barrel shifter; and
storing the N bit wide subset in a data register.

21. The method of claim 20 wherein N equals eight.

22. The method of claim 20 further comprising the step of comparing the sampled parallel data signal with a desired framing sequence to calculate the offset.

23. The method of claim 22 wherein the step of comparing the sampled parallel data signal with a desired framing sequence to calculate the offset is performed by a comparator.

* * * * *